(12) United States Patent
Ker et al.

(10) Patent No.: US 7,289,307 B2
(45) Date of Patent: Oct. 30, 2007

(54) HIGH VOLTAGE ESD CIRCUIT BY USING LOW-VOLTAGE DEVICE WITH SUBSTRATE-TRIGGER AND GATE-DRIVEN TECHNIQUE

(75) Inventors: Ming Dou Ker, Hsin-Chu (TW); Chien Ming Lee, Taidong (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 241 days.

(21) Appl. No.: 11/269,620

(22) Filed: Nov. 9, 2005

(65) Prior Publication Data

US 2007/0103825 A1    May 10, 2007

(51) Int. Cl.
*H02H 3/22* (2006.01)
(52) U.S. Cl. .......................... 361/56; 361/111
(58) Field of Classification Search ................. 361/56, 361/57, 111; 257/355, 360
See application file for complete search history.

(56) References Cited

U.S. PATENT DOCUMENTS 5,946,177 A * 8/1999 Miller et al. ................. 361/56
7,221,551 B2 * 5/2007 Chen ........................... 361/230

* cited by examiner

*Primary Examiner*—Michael Sherry
*Assistant Examiner*—Danny Nguyen
(74) *Attorney, Agent, or Firm*—Bacon & Thomas, PLLC

(57) ABSTRACT

An ESD protection circuit is disclosed. The ESD protection circuit includes a stacked MOS circuit and a trigger current generating circuit. The trigger current generating circuit will generate trigger signal(s) to turn on the stacked MOS circuit under ESD stress condition. The ESD voltage can thus be discharged through the current path formed by the stacked MOS circuit. A lower trigger voltage is achieved by technologies disclosed, which will make an integrated circuit more sensitive to ESD.

24 Claims, 7 Drawing Sheets

HIGH VOLTAGE ESD CIRCUIT BY USING LOW-VOLTAGE DEVICE WITH SUBSTRATE-TRIGGER AND GATE-DRIVEN TECHNIQUE

BACKGROUND OF THE INVENTION

1. Field of the Invention

The present invention relates to an ESD (Electrostatic Discharge) protection circuit, and more particularly to an ESD protection circuit capable of bypassing electrostatic charges under ESD stress condition by using low-voltage-tolerant components.

2. Description of the Prior Art

Because of reduction in dimension as well as significant improvement in precision, advanced electronic devices, especially those tiny elements thereinside, are sensitive to ESD and need to be properly protected therefrom. Thus, most high precision electronic devices provide additional ESD protection circuits to guard internal components against accidental ESD damage which is caused from unexpected contact with some object around or a human body.

FIG. 1 shows the I-V (current-voltage) characteristic curve of a conventional stacked NMOS (Negative Metal Oxide Semiconductor) ESD protection circuit, where the X-axis represents the drain-to-source voltage and the Y-axis represents the drain current. As shown in FIG. 1, when the voltage across drain and source gradually accumulates, the drain current increases correspondingly. As soon as the drain-to-source voltage is going to exceed a trigger voltage, it starts to experience a snapback session due to the "punch through" effect. The snapback session goes on until the drain-to-source voltage reaches down to a holding voltage. After that, the drain-to-source voltage increases smoothly and so does the drain current. The difference between the trigger voltage level and the holding voltage level is known as the snap-back region.

As can be noted from above description, when the ESD voltage is greater than the trigger voltage, the stacked NMOS functioning as an ESD protection circuit will be activated, a current will thus flow through the stacked NMOS and the electrostatic charges will bypass therethrough to the ground. Internal components of electronic devices are therefore protected from being damaged by an ESD. A limitation of conventional stacked NMOS ESD protection circuit is, however, when the electrostatic voltage is under the trigger voltage, the ESD protection circuit will fail to be activated. The electrostatic charges will consequently be kept in the electronic device and become a potential damage source to the device.

FIG. 2 shows a conventional stacked NMOS ESD protection circuit embedded in an integrated circuit (or IC). The integrated circuit works under mixed-voltage sources, say Vdd and Vcc, internally such that interfacing of semiconductor chips and sub-systems operating in different internal voltage levels can be achieved. As shown in FIG. 2, an I/O pad is connected with the internal circuit and the drain of the first NMOS (NMOS1). The gate and source of NMOS1 are respectively coupled with the voltage input terminal Vdd and the source of the second NMOS (NMOS2). The gate of NMOS2 is coupled to another voltage input terminal Vcc and the source of NMOS2 is grounded.

In FIG. 2, NMOS1 and NMOS2 are stacked in a cascade configuration such that a common diffusion region formed in the node between them. The structure of the stacked NMOS is equivalent to a parasite lateral bipolar junction transistor (hereinafter "LBJT"). When the electrostatic voltage is higher than a trigger voltage, the parasite LBJT will be activated and electrostatic charges inside will be discharged therethrough. As mentioned above, however, when the electrostatic voltage is not high enough, the LBJT will fail to be activated. As the bypassing path is still disabled, the electrostatic charges will keep residing in the integrated circuit and finally damage the MOS (Metal Oxide Semiconductor) gate oxide in the I/O buffer inside the I/O pad. Since the breakdown voltage of an MOS gate oxide will become lower in a mixed-voltage I/O circuit, the gate oxide is readily damaged by the accumulated electrostatic charges.

In view of above limitation in a conventional ESD protection circuit, there is a need to provide an ESD protection circuit which is more sensitive to electrostatic charges such that a lower trigger voltage can be achieved to have a better ESD protection for an integrated circuit.

SUMMARY OF THE INVENTION

In view of the foregoing, it is an object of the present invention to provide an ESD protection circuit which is more sensitive to electrostatic charges and is able to be activated by a lower electrostatic voltage.

Another object of the present invention is to provide an ESD protection circuit which is composed of low-voltage-tolerant electronic components and is capable of sustaining a higher ESD level.

According to above objects, the present invention provides an ESD protection circuit which is essentially composed of a number of ESD detection circuits, a trigger current generating circuit, and a stacked MOS circuit containing an equivalent LBJT. As soon as the electrostatic voltage exceeds some specific level, the trigger current generating circuit receives ESD detection signals generated from the ESD detection circuits and outputs a trigger signal. The trigger signal will then activate the stacked MOS circuit such that the ESD voltage can be discharged through the path formed thereby.

DETAILED DESCRIPTION OF THE INVENTION

The detailed description of the present invention will be discussed in the following embodiments, which are not intended to limit the scope of the present invention, but can be adapted for other applications.

The present invention discloses an ESD protection circuit applicable to an integrated circuit using mixed-voltage internally. There are generally two different voltage sources in such kind of integrated circuit. The ESD protection circuit disclosed herein is to function as an ESD bypassing path between voltage sources and the ground. Under ESD stress condition, the ESD protection circuit will be activated and bypass the electrostatic charges to ground before the internal components of the integrated circuit is damaged.

Figure 1:
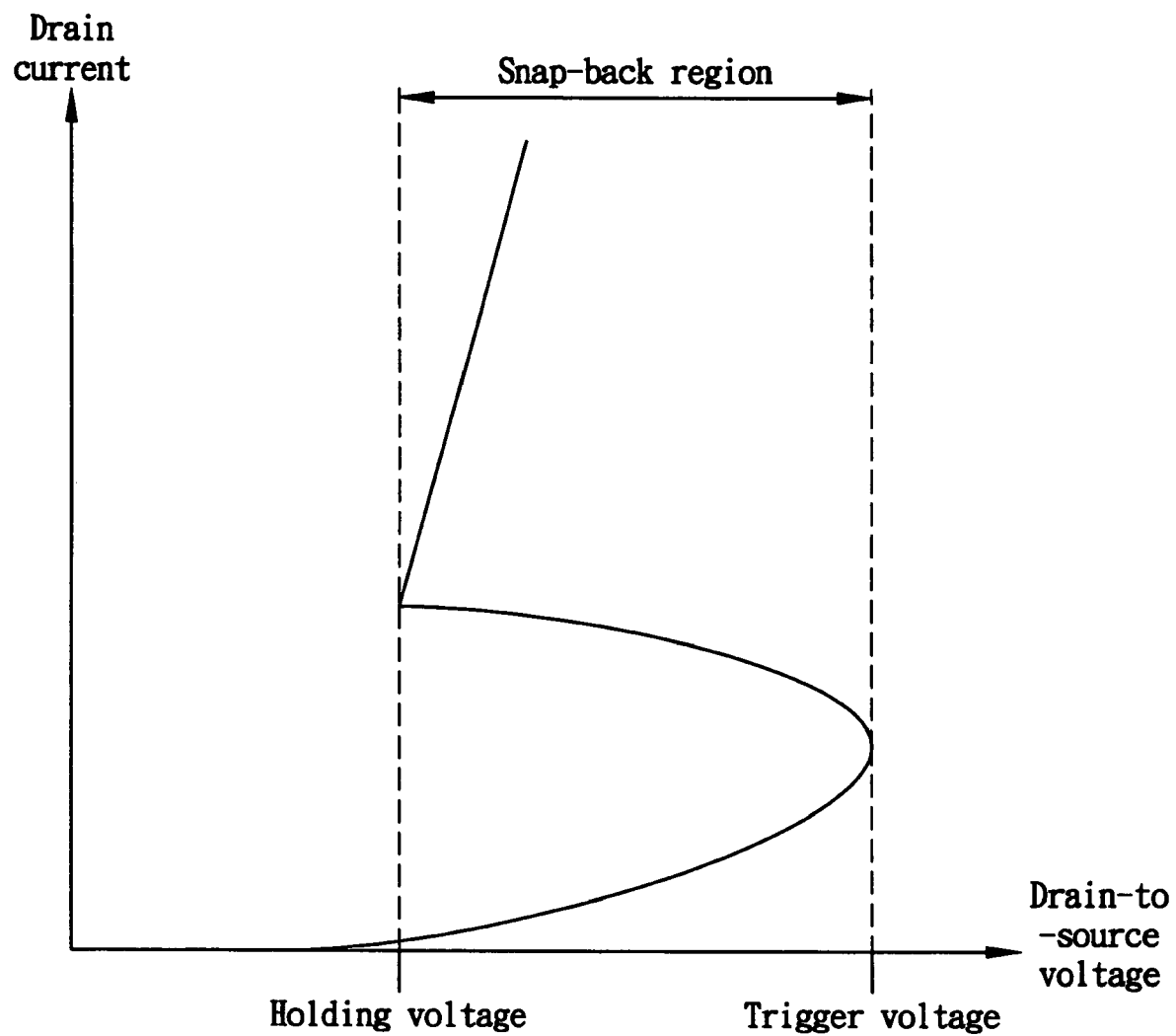
FIG. 1 shows the I-V characteristic curve of a conventional stacked NMOS circuit.
Figure 2:
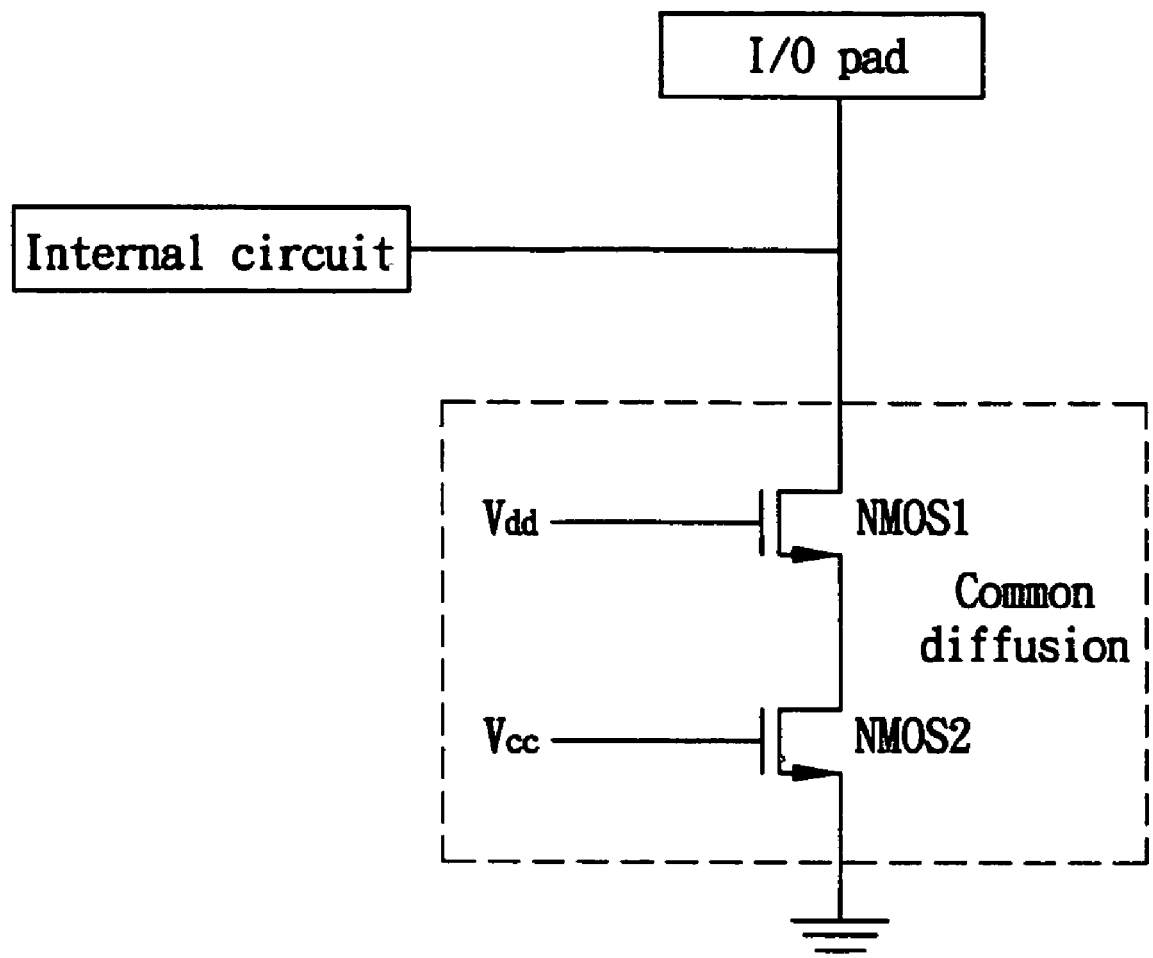
FIG. 2 shows the schematic diagram of a conventional stacked NMOS circuit.
Figure 3:
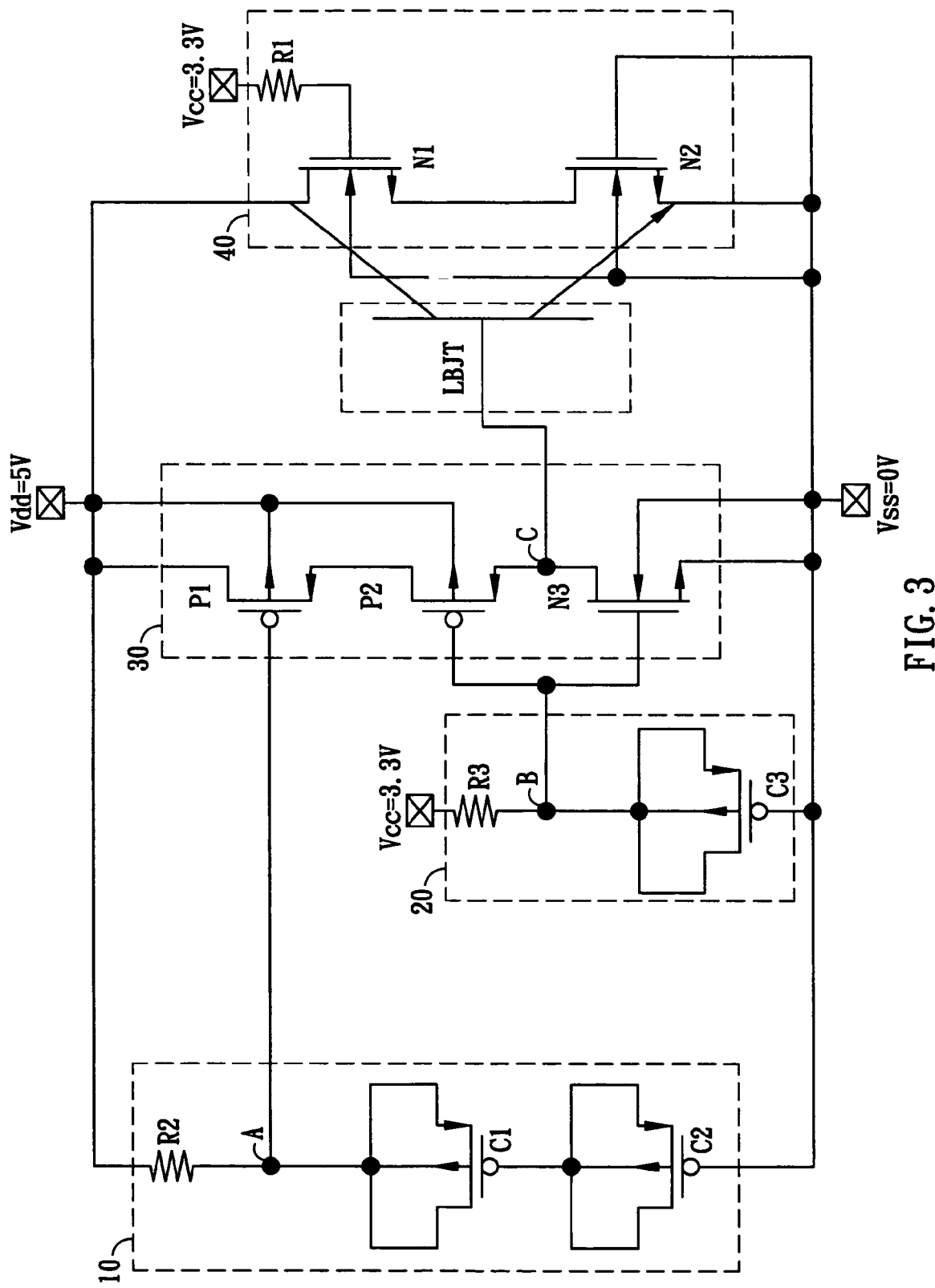
FIG. 3 to FIG. 7 are the schematic diagrams of the preferred embodiments of ESD protection circuits in accordance with the present invention.

FIG. 3 illustrates an embodiment of the ESD protection circuit in accordance with the present invention. It includes a first ESD detection circuit 10, a second ESD detection circuit 20, a trigger current generating circuit 30, and a stacked MOS circuit 40 in which an equivalent LBJT is embedded. A common diffusion region is formed in the node between the two NMOS's in the stacked MOS circuit 40, which can thus be treated as an LBJT. The stacked MOS circuit 40 includes a first NMOS (hereinafter "N1"), a second NMOS (hereinafter "N2") and a first resistor R1. The drain of N1 and thus the collector of the LBJT are coupled with a first voltage input terminal Vdd. The gate of N1 is coupled with a terminal of the first resistor R1. The source of N1 is coupled with the drain of N2. The source of N2 and thus the emitter of the LBJT are grounded. The gate of N2 and the base terminals of both N1 and N2 are also grounded. The other terminal of the first resistor R1 is coupled to a second voltage input terminal Vcc.

The first ESD detection circuit 10 includes a second resistor R2, a first capacitor C1, and a second capacitor C2. The first terminal of the second resistor R2 is coupled to the first voltage input terminal Vdd. The second terminal of the second resistor R2 outputs a first ESD detection signal. C1 and C2 are connected serially between the second terminal of R2 and the ground Vss as shown in FIG. 3. The second ESD detection circuit 20 includes a third resistor R3 and a third capacitor C3. The first terminal of the third resistor R3 is coupled to the second voltage input terminal Vcc. The other terminal of the third resistor R3 outputs a second ESD detection signal. The third capacitor C3 is connected between the other terminal of the third resistor R3 and the ground Vss.

The trigger current generating circuit 30 includes a first PMOS (hereinafter "P1"), a second PMOS (hereinafter "P2"), and a third NMOS (hereinafter "N3"). The drain of P1 is coupled to the first voltage input terminal Vdd. The gate of P1 receives the first ESD detection signal. The drain of P2 and the source of P1 are coupled together. The base terminals of P1 and P2 are coupled to the first voltage input terminal Vdd. The gates of N3 and P2 are coupled together to receive the second ESD detection signal. The drain of N3 and the source of P2 are coupled together and output a trigger signal. The base and source of N3 are grounded to Vss.

As an ESD voltage is somehow coupled to the first voltage input terminal Vdd, nodes A and B respectively output the first ESD detection signal and the second ESD detection signal such that gates of P1 and P2 respectively receive the two ESD detection signals which are basically low voltage level. P1 and P2 are thus activated and a trigger current flows through the path formed by the series connection of P1 and P2, which in turn causes a trigger signal to output to the base (i.e., node C) of the LBJT. The LBJT is activated and thus N1 and N2 are activated. Consequently, N1 and N2 form an ESD discharge path between the first voltage input terminal Vdd and the ground terminal Vss such that ESD voltage can be discharged therethrough and internal circuits are protected from damage during an ESD stress event.

Figure 4:
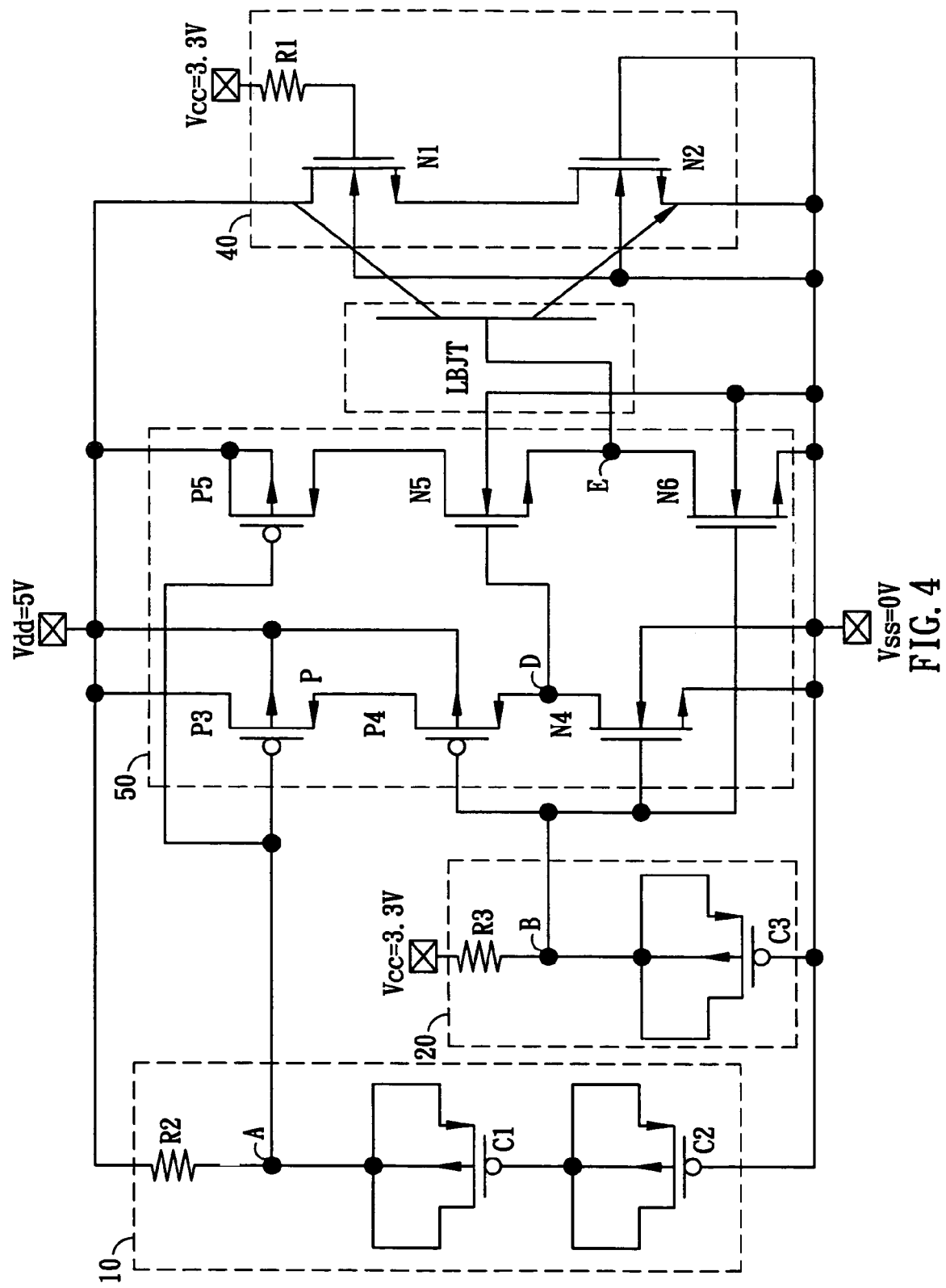

Similar to FIG. 3, FIG. 4 shows another embodiment in accordance with the present invention. The only change in FIG. 4 is the trigger current generating circuit 50 whose function is detailed in following paragraph.

The trigger current generating circuit 50 includes a third PMOS (hereinafter "P3"), a fourth PMOS (hereinafter "P4"), a fifth PMOS (hereinafter "P5"), a fourth NMOS (hereinafter "N4"), a fifth NMOS (hereinafter "N5"), and a sixth NMOS (hereinafter "N6"). The drain and base of P3, the base of P4, and the drain and base of P5 are all coupled together to the first voltage input terminal Vdd. The gates of P3 and P5 are coupled together to receive the first ESD detection signal. The source of P3 and the drain of P4 are coupled together. Likewise, the source of P5 and the drain of N5 are also coupled together. The gates of P4, N4, and N6 are coupled together to receive the second ESD detection signal. The source of P4, the drain of N4, and the gate of N5 are coupled together. The source of N5 and the drain of N6 are coupled together and output a trigger signal. The base terminals of N5 and N6, the source of N6, and the base and source of N4 are all grounded to Vss.

As an ESD voltage is coupled to the first voltage input terminal Vdd, nodes A and B respectively output the first ESD detection signal and the second ESD detection signal such that P3, P4, and P5 are all activated. The activation of P3 and P4 will cause a current flow to node D and thus N5 will be activated. Since both P5 and N5 are activated now, a trigger current will flow through P5 and N5 to node E. The trigger current will activate the LBJT and thus N1 and N2 are both activated. Consequently, N1 and N2 form an ESD discharge path between the first voltage input terminal Vdd and the ground terminal Vss such that ESD voltage can be discharged therethrough and internal circuits are protected against unexpected damage.

Figure 5:
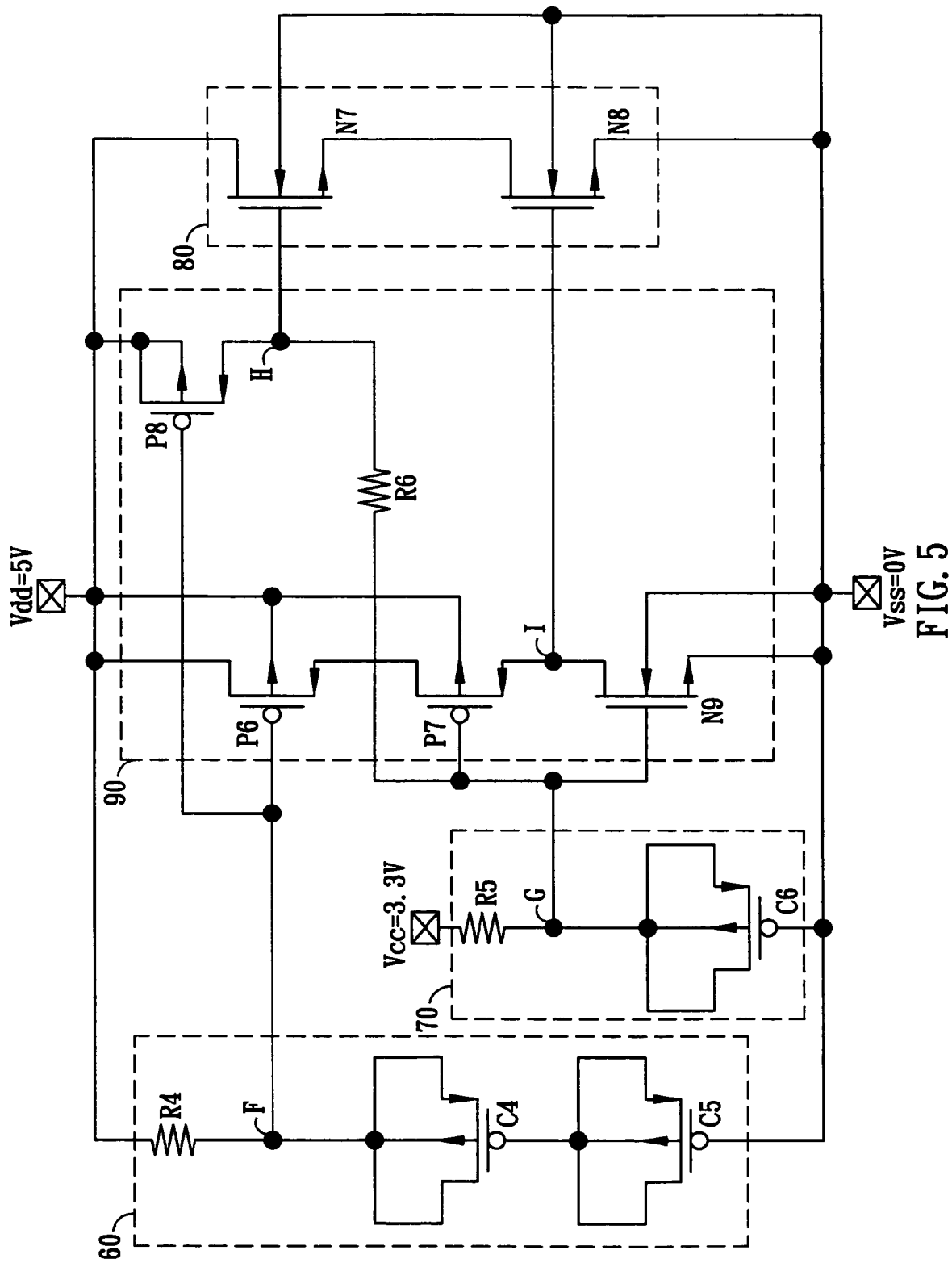

FIG. 5 shows another embodiment of the ESD protection circuit in accordance with the present invention. It includes a first ESD detection circuit 60, a second ESD detection circuit 70, a gate driving circuit 90 and a stacked MOS circuit 80. The stacked MOS circuit includes a seventh NMOS (hereinafter "N7") and an eighth NMOS (hereinafter "N8"). The drain of N7 is coupled to the first voltage input terminal Vdd. The gate of N7 receives a first gate driving signal. The source of N7 is coupled with the drain of N8. The source of N8 is grounded to Vss. The gate of N8 receives a second gate driving signal. The base terminals of N7 and N8 are grounded to Vss.

The first ESD detection circuit 60 includes a fourth resistor R4, a fourth capacitor C4, and a fifth capacitor C5. The first terminal of the fourth resistor R4 is coupled to the first voltage input terminal Vdd; the second terminal of R4 outputs a first ESD detection signal. C4 and C5 are connected serially between the second terminal of R4 and the ground Vss as shown in FIG. 5. The second ESD detection circuit 70 includes a fifth resistor R5 and a sixth capacitor C6. The first terminal of the fifth resistor R5 is coupled to the second voltage input terminal Vcc. The other terminal of the fifth resistor R5 outputs a second ESD detection signal. The sixth capacitor C6 is connected between the other terminal of the fifth resistor R5 and the ground Vss.

The gate driving circuit 90 includes a sixth PMOS hereinafter "P6"), a seventh PMOS (hereinafter "P7"), an eighth PMOS (hereinafter "P8"), a sixth resistor R6, and a ninth NMOS (hereinafter "N9"). The drain and base of P6, the drain and base of P8, and the base of P7 are all coupled to the first voltage input terminal Vdd. The gates of P6 and P8 are coupled together to receive the first ESD detection signal. The source of P6 is coupled with the drain of P7. The gates of P7 and N9, and the first terminal of the sixth resistor R6 are coupled together to receive the second ESD detection signal. The second terminal of R6 is coupled to the source of P8 and outputs the first gate driving signal. The source of P7 and the drain of N9 are coupled together to output the second gate driving signal. The base and source of N9 are grounded to Vss.

As an ESD voltage is coupled to the first voltage input terminal Vdd, node F and G will respectively output the first ESD detection signal and the second ESD detection signal such that P6, P8, and P7 are all activated. The series connection of P6 and P7 forms a path through which a current flows from the first voltage input terminal Vdd to node I, which functions as the second gate driving signal and activates N8. Moreover, P8 is also activated and forms a path through which a current flows from the first voltage input terminal Vdd to node H, which functions as the first gate driving signal and activates N7. Thus, both N7 and N8 are activated and form an ESD discharge path between the first voltage input terminal Vdd and the ground terminal Vss such that the ESD voltage can be discharged through the path and internal circuits are thus guarded from ESD damage.

Figure 6:
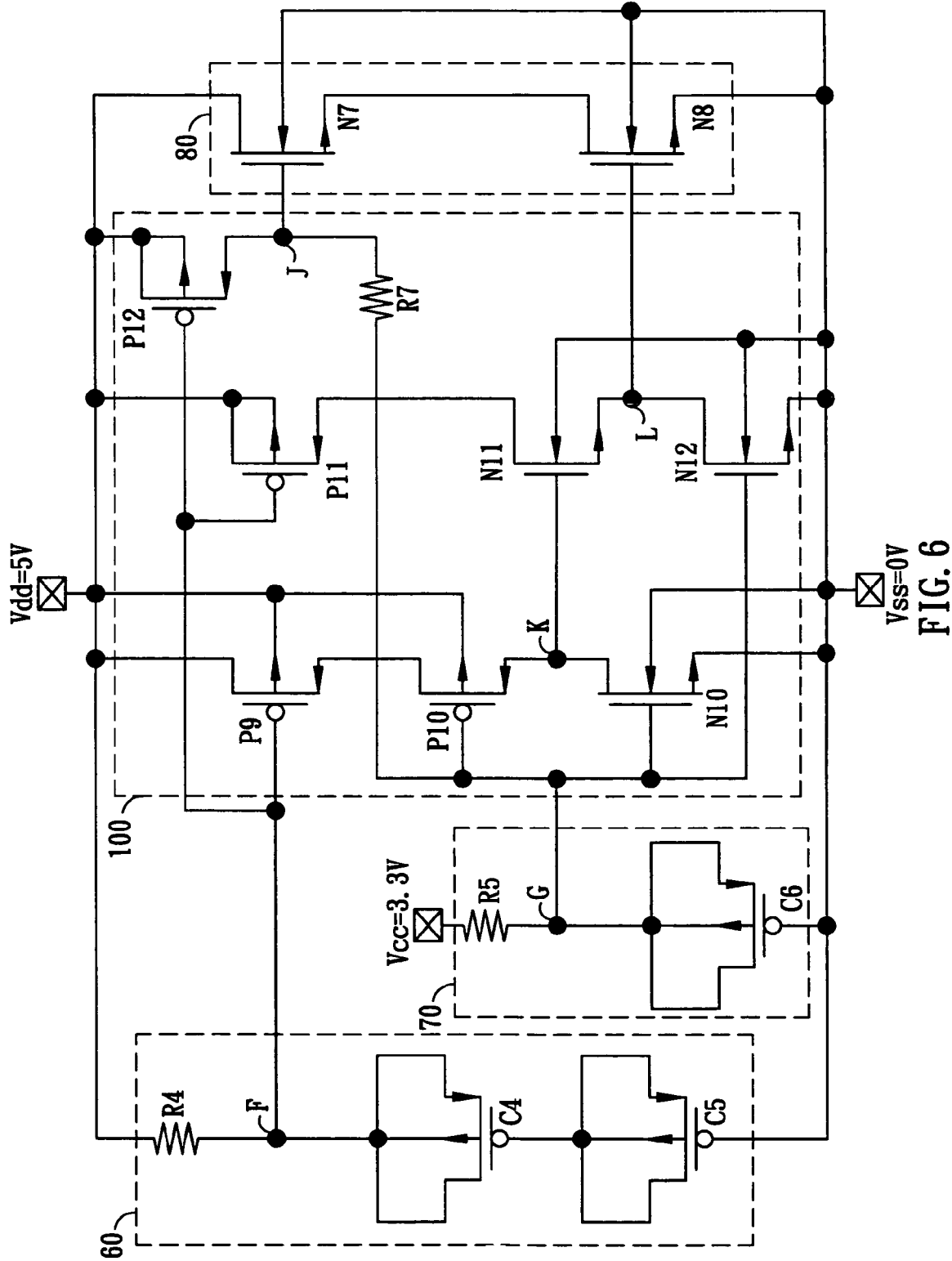

Similar to FIG. 5, FIG. 6 shows another embodiment in accordance with the present invention. The only change in FIG. 6 is the gate driving circuit 100 whose function will be detailed in following paragraph.

The gate driving circuit 100 includes a ninth PMOS (hereinafter "P9"), a tenth PMOS (hereinafter "P10"), an eleventh PMOS (hereinafter "P11"), a twelfth PMOS (hereinafter "P12"), a seventh resistor R7, a tenth NMOS (hereinafter "N10"), an eleventh NMOS (hereinafter "N11"), and a twelfth NMOS (hereinafter "N12"). The drain and base of P9, the base terminal of P10, the drain and base of P11, and the drain and base of P12 are all coupled together to a first voltage input terminal Vdd. The gates of P9, P11, and P12 are coupled together to receive the first ESD detection signal. The source of P12 and the second terminal of the seventh resistor R7 are coupled together to output the first gate driving signal. The first terminal of the seventh resistor R7, and the gates of P10, N10, and N12 are coupled together to receive the second ESD detection signal. The source of P10, the drain of N10, and the gate of N11 are coupled together. The source of N11 and the drain of N12 are coupled together to output the second gate driving signal. The source and base of N10, the source and base of N12, and the base terminal of N11 are coupled together to the ground terminal Vss. The source of P9 is coupled with the drain of P10. The source of P11 is coupled with the drain of N11.

As an ESD voltage is coupled to the first voltage input terminal Vdd, node F and node G respectively output the first ESD detection signal and the second ESD detection signal which are both low voltage level, such that P9, P10, P11, and P12 are all activated. The activation of P12 forms a path through that a current flows from the first voltage input terminal Vdd to node J, which functions as the first gate driving signal and activates N7. The activation of P9 and P10 forms another path through that a current flows from the first voltage input terminal Vdd to node K, which in turn activates N11. The activation of P11 and N11 again forms another path through that a current flows from the first voltage input terminal to node L, which functions as the second gate driving signal and activates N8. Both N7 and N8 are now activated simultaneously and form an ESD path between Vdd and Vss, through that the ESD voltage can be discharged and IC internal components are protected.

Figure 7:
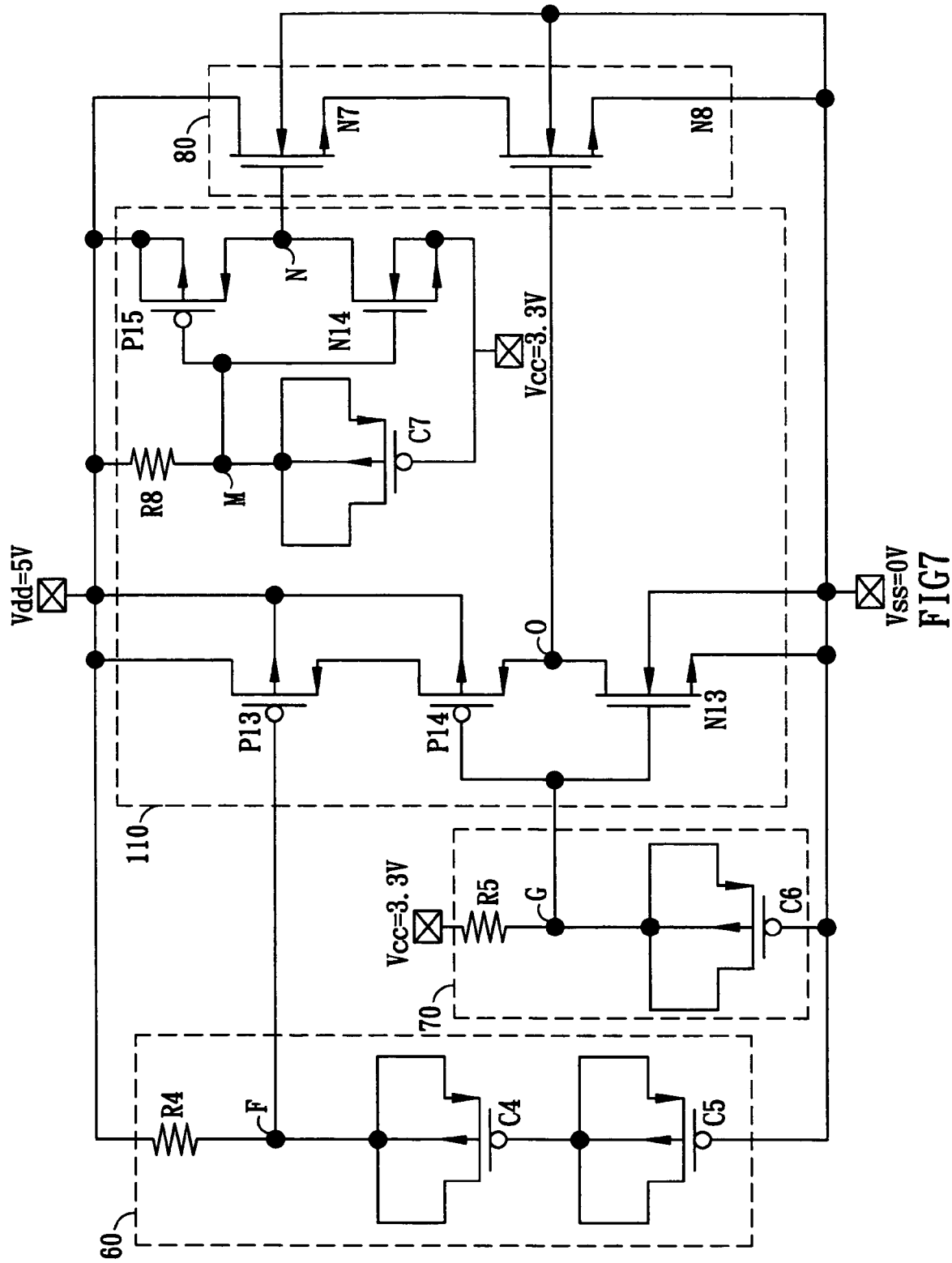

FIG. 7 shows yet another embodiment in accordance with the present invention. Likewise, FIG. 7 is similar to FIG. 5 except that it provided a modified gate driving circuit 110 which is going to be described in following paragraph.

The gate driving circuit 110 includes a thirteenth PMOS (hereinafter "P13"), a fourteenth PMOS (hereinafter "P14"), a fifteenth PMOS (hereinafter "P15"), an eighth resistor R8, a thirteenth NMOS (hereinafter "N13"), a fourteenth NMOS hereinafter "N14"), and a seventh capacitor C7. The drain and base of P13, the base terminal of P14, the drain and base of P15, and the first terminal of the eighth resistor R8 are all coupled together to the first voltage input terminal Vdd. The gate of P13 receives the first ESD detection signal. The gates of P14 and N13 are coupled together to receive the second ESD detection signal. The base and source of N13 are coupled together to the ground terminal Vss. The source of P14 and the drain of N13 are coupled together to output the second gate driving signal. The source of P13 is coupled with the drain of P14. The second terminal of the eighth resistor R8, the gates of P15 and N14, and the first terminal of the seventh capacitor C7 are coupled together. The base and source of N14 and the second terminal of the seventh capacitor C7 are coupled together to the second voltage input terminal Vcc. The source of P15 and the drain of N14 are coupled together to output the first gate driving signal.

As an ESD voltage is coupled to the first voltage input terminal Vdd, node F and node G respectively output the first ESD detection signal and the second ESD detection signal which are both low voltage level, such that P13, and P14 are activated. Moreover, P15 is also activated because of the low voltage level in node M. The activation of P15 forms a path through that a current flows from the first voltage input terminal Vdd to node N, which functions as the first gate driving signal and activates N7. The activation of P13 and 14 will form another path through that a current passed from the first voltage input terminal Vdd to node O, which functions as the second gate driving signal and activates N8. Both N7 and N8 are now activated simultaneously and form an ESD path between Vdd and Vss, through that the ESD voltage can be discharged and IC internal components are protected.

This example adopts a deep N well NMOS device for N14 in the gate driving circuit 110 such that both the base and source of N14 are connected to the second voltage input terminal Vcc instead of grounding the base to Vss. Such disposition will prevent the gate oxide of N14 from potential damages due to an excessive voltage difference between the gate and the base.

Although only preferred embodiments have been illustrated and described, it will be appreciated by those skilled in the art that various modifications may be made without departing from the scope of the present invention, which is intended to be limited solely by the appended claims.

What is claimed is:

1. An ESD protection circuit comprising:
   a first ESD detection circuit comprising three terminals, the first terminal of the first ESD detection circuit coupled to a first input terminal, the second terminal of the first ESD detection circuit coupled to a ground terminal, the third terminal of the first ESD detection circuit outputting a first ESD detection signal;
   a second ESD detection circuit comprising three terminals, the first terminal of the second ESD detection circuit coupled to a second input terminal, the second terminal of the second ESD detection circuit coupled to said ground terminal, the third terminal of the second ESD detection circuit outputting a second ESD detection signal;
   a trigger current generating circuit comprising five terminals, the first terminal of the trigger current generating circuit coupled to said first input terminal, the second terminal of the trigger current generating circuit coupled to said ground terminal, the third terminal of the trigger current generating circuit receiving said first ESD detection signal, the fourth terminal of the trigger current generating circuit receiving said second ESD detection signal, the fifth terminal of the trigger current generating circuit outputting a trigger signal;

a lateral bipolar junction transistor receiving said trigger signal through its base terminal; and a stacked MOS circuit comprising a first NMOS, a second NMOS and a first resistor, wherein the drain of said first NMOS is coupled to both said first input terminal and the collector of said lateral bipolar junction transistor, the gate of said first NMOS is coupled with the first terminal of said first resistor, the source of said first NMOS is coupled with the drain of said second NMOS, the source of said second NMOS is coupled to both said ground terminal and the emitter of said lateral bipolar junction transistor, the gate of said second NMOS is also coupled to said ground terminal, the base terminals of said first NMOS and said second NMOS are also coupled together to said ground terminal, and the second terminal of said first resistor is coupled to said second input terminal;

wherein as an ESD voltage coupled to said first input terminal is greater than a specific level, said trigger current generating circuit will output said trigger signal such that said stacked MOS circuit is turned into an ESD path to discharge said ESD voltage.

2. The ESD protection circuit as claimed in claim 1, wherein said trigger current generating circuit comprises:

a first PMOS, the drain of said first PMOS coupled with said first input terminal, the gate of said first PMOS receiving the first ESD detection signal;

a second PMOS, the drain of said second PMOS coupled with the source of said first PMOS, the base terminals of said first PMOS and said second PMOS coupled together to said first input terminal; and a third NMOS, the gates of said third NMOS and said second PMOS coupled together to receive said second ESD detection signal, the drain of said third NMOS and the source of said second PMOS coupled together to output said trigger signal, the base and source of said third NMOS coupled together to said ground terminal.

3. The ESD protection circuit as claimed in claim 2, wherein said first ESD detection circuit comprises:

a second resistor, the first terminal of the second resistor coupled to said first input terminal, the second terminal of the second resistor outputting said first ESD detection signal;

a first capacitor, the first terminal of the first capacitor coupled with said second terminal of said second resistor; and a second capacitor, the first terminal of the second capacitor coupled with said second terminal of said first capacitor, the second terminal of the second capacitor coupled to said ground terminal.

4. The ESD protection circuit as claimed in claim 3, wherein said second ESD detection circuit comprises:

a third resistor, the first terminal of the third resistor coupled with said second input terminal, the second terminal of the third resistor outputting said second ESD detection signal; and a third capacitor, the first terminal of the third capacitor coupled with said second terminal of said third resistor, the second terminal of the third capacitor coupled to said ground terminal.

5. The ESD protection circuit as claimed in claim 4, wherein said first capacitor, said second capacitor, and said third capacitor are all capacitors composed of MOSFETs (Metal Oxide Semiconductor Field Effect Transistors).

6. The ESD protection circuit as claimed in claim 5, wherein said lateral bipolar junction transistor is a parasite lateral bipolar junction transistor.

7. The ESD protection circuit as claimed in claim 5, wherein said trigger current generating circuit comprises a first PMOS, a second PMOS, a third PMOS, a third NMOS, a fourth NMOS, and a fifth NMOS;

the drain and base of said first PMOS, the base of said second PMOS and the drain and base of said third PMOS are all coupled together to said first input terminal;

the gates of said first PMOS and said third PMOS are coupled together to receive said first ESD detection signal;

the source of said first PMOS is coupled with the drain of said second PMOS;

the source of said third PMOS is coupled with the drain of said fourth NMOS;

the gates of said second PMOS, said third NMOS and said fifth NMOS are coupled together to receive said second ESD detection signal;

the source of said second PMOS, the drain of said third NMOS, and the gate of said fourth NMOS are coupled together;

the source of said fourth NMOS and the drain of said fifth NMOS are coupled together to output said trigger signal; and the base terminals of said fourth NMOS and said fifth NMOS, the source of said fifth NMOS, and the base terminal and source of said third NMOS are all coupled together to said ground terminal.

8. The ESD protection circuit as claimed in claim 7, wherein said first ESD detection circuit comprises:

a second resistor, the first terminal of the second resistor coupled to said first input terminal, the second terminal of the second resistor outputting said first ESD detection signal;

a first capacitor, the first terminal of the first capacitor coupled with said second terminal of said second resistor; and a second capacitor, the first terminal of the second capacitor coupled with said second terminal of said first capacitor, the second terminal of the second capacitor coupled to said ground terminal.

9. The ESD protection circuit as claimed in claim 8, wherein said second ESD detection circuit comprises:

a third resistor, the first terminal of the third resistor coupled with said second input terminal, the second terminal of the third resistor outputting said second ESD detection signal; and a third capacitor, the first terminal of the third capacitor coupled with said second terminal of said third resistor, the second terminal of the third capacitor coupled to said ground terminal.

10. The ESD protection circuit as claimed in claim 9, wherein said first capacitor, said second capacitor, and said third capacitor are all capacitors composed of MOSFETs.

11. The ESD protection circuit as claimed in claim 10, wherein said lateral bipolar junction transistor is a parasite lateral bipolar junction transistor.

12. An ESD protection circuit comprising:

a first ESD detection circuit comprising three terminals, the first terminal of the first ESD detection circuit coupled to a first input terminal, the second terminal of the first ESD detection circuit coupled to a ground terminal, the third terminal of the first ESD detection circuit outputting a first ESD detection signal;

a second ESD detection circuit comprising three terminals, the first terminal of the second ESD detection circuit coupled to a second input terminal, the second terminal of the second ESD detection circuit coupled to said ground terminal, the third terminal of the second ESD detection circuit outputting a second ESD detection signal;

a gate driving circuit comprising six terminals, the first terminal of the gate driving circuit coupled to said first input terminal, the second terminal of the gate driving circuit coupled to said ground terminal, the third terminal of the gate driving circuit receiving said first ESD detection signal, the fourth terminal of the gate driving circuit receiving said second ESD detection signal, the fifth terminal of the gate driving circuit outputting a first gate driving signal, the sixth terminal of the gate driving circuit outputting a second gate driving signal; and a stacked MOS circuit comprising a first NMOS and a second NMOS, wherein the drain of said first NMOS is coupled to said first input terminal, the gate of said first NMOS receives said first gate driving signal, the source of said first NMOS is coupled with the drain of said second NMOS, the source of said second NMOS is coupled to said ground terminal, the gate of said second NMOS receives said second gate driving signal, and the base terminals of said first NMOS and said second NMOS are coupled together to said ground terminal;

wherein as an ESD voltage coupled to said first input terminal is greater than a specific level, said gate driving circuit will output said first gate driving signal and said second gate driving signal such that said stacked MOS circuit is turned into an ESD path to discharge said ESD voltage.

13. The ESD protection circuit as claimed in claim 12, wherein said gate driving circuit comprises a first PMOS, a second PMOS, a third PMOS, a first resistor, and a third NMOS;

the drain and base of said first PMOS, the drain and base of said third PMOS, and the base terminal of said second PMOS are coupled together to said first input terminal;

the gates of said first PMOS and said third PMOS are coupled together to receive said first ESD detection signal;

the source of said first PMOS and the drain of said second PMOS are coupled together;

the gates of said second PMOS and said third NMOS, and the first terminal of said first resistor are coupled together to receive said second ESD detection signal;

the second terminal of said first resistor and the source of said third PMOS are coupled together to output said first gate driving signal;

the source of said second PMOS and the drain of said third NMOS are coupled together to output said second gate driving signal; and the base and source of said third NMOS are coupled together to said ground terminal.

14. The ESD protection circuit as claimed in claim 13, wherein said first ESD detection circuit comprises:

a second resistor, the first terminal of the second resistor coupled to said first input terminal, the second terminal of the second resistor outputting said first ESD detection signal;

a first capacitor, the first terminal of the first capacitor coupled with said second terminal of said second resistor; and a second capacitor, the first terminal of the second capacitor coupled with said second terminal of said first capacitor, the second terminal of the second capacitor coupled to said ground terminal.

15. The ESD protection circuit as claimed in claim 14, wherein said second ESD detection circuit comprises:

a third resistor, the first terminal of the third resistor coupled with said second input terminal, the second terminal of the third resistor outputting said second ESD detection signal; and a third capacitor, the first terminal of the third capacitor coupled with said second terminal of said third resistor, the second terminal of the third capacitor coupled to said ground terminal.

16. The ESD protection circuit as claimed in claim 15, wherein said first capacitor, said second capacitor, and said third capacitor are all capacitors composed of MOSFETs.

17. The ESD protection circuit as claimed in claim 12, wherein said gate driving circuit comprises a first PMOS, a second PMOS, a third PMOS, a fourth PMOS, a first resistor, a third NMOS, a fourth NMOS, and a fifth NMOS;

the drain and base of said PMOS, the base terminal of said second PMOS, and the drains and base terminals of said third PMOS and said fourth PMOS are coupled together to said first input terminal;

the gates of said first PMOS, said third PMOS, and said fourth PMOS are coupled together to receive said first ESD detection signal;

the source of said fourth PMOS and the second terminal of said first resistor are coupled together to output said first gate driving signal;

the first terminal of said first resistor, the gate of said second PMOS, the gate of said third NMOS, and the gate of said fifth NMOS are coupled together to receive said second ESD detection signal;

the source of said second PMOS, the drain of said third NMOS, and the gate of said fourth NMOS are coupled together;

the source of said fourth NMOS and the drain of said fifth NMOS are coupled together to output said second gate driving signal;

the source and base of said third NMOS, the source and base of said fifth NMOS, and the base terminal of said fourth NMOS are coupled together to said ground terminal;

the source of said first PMOS is coupled with the drain of said second PMOS;

the source of said third PMOS is coupled with the drain of said fourth NMOS.

18. The ESD protection circuit as claimed in claim 17, wherein said first ESD detection circuit comprises:

a second resistor, the first terminal of the second resistor coupled to said first input terminal, the second terminal of the second resistor outputting said first ESD detection signal;

a first capacitor, the first terminal of the first capacitor coupled with said second terminal of said second resistor; and a second capacitor, the first terminal of the second capacitor coupled with said second terminal of said first capacitor, the second terminal of the second capacitor coupled to said ground terminal.

19. The ESD protection circuit as claimed in claim 18, wherein said second ESD detection circuit comprises:

a third resistor, the first terminal of the third resistor coupled with said second input terminal, the second terminal of the third resistor outputting said second ESD detection signal; and a third capacitor, the first terminal of the third capacitor coupled with said second terminal of said third resistor, the second terminal of the third capacitor coupled to said ground terminal.

20. The ESD protection circuit as claimed in claim 19, wherein said first capacitor, said second capacitor, and said third capacitor are all capacitors composed of MOSFETs.

21. The ESD protection circuit as claimed in claim 12, wherein said gate driving circuit comprises a first PMOS, a second PMOS, a third PMOS, a fourth PMOS, a first resistor, a third NMOS, a fourth NMOS, and a fourth capacitor;

the drain and base of said first PMOS, the base terminal of said second PMOS, the drain and base of said third PMOS, and the first terminal of said first resistor are coupled together to said first input terminal;

the gate of said first PMOS receives said first ESD detection signal;

the gates of said second PMOS and said third NMOS are coupled together to receive said second ESD detection signal;

the base and source of said third NMOS are coupled together to said ground terminal;

the source of said second PMOS and the drain of said third NMOS are coupled together to output said second gate driving signal;

the source of said first PMOS is coupled with the drain of said second PMOS;

the second terminal of said first resistor, the gates of said third PMOS and said fourth NMOS, and the first terminal of said fourth capacitor are coupled together;

the base and source of said fourth NMOS and the second terminal of said fourth capacitor are coupled together to said second input terminal; and the source of said third PMOS and the drain of said fourth NMOS are coupled together to output said first gate driving signal.

22. The ESD protection circuit as claimed in claim 21, wherein said first ESD detection circuit comprises:

a second resistor, the first terminal of the second resistor coupled to said first input terminal, the second terminal of the second resistor outputting said first ESD detection signal;

a first capacitor, the first terminal of the first capacitor coupled with said second terminal of said second resistor; and a second capacitor, the first terminal of the second capacitor coupled with said second terminal of said first capacitor, the second terminal of the second capacitor coupled to said ground terminal.

23. The ESD protection circuit as claimed in claim 22, wherein said second ESD detection circuit comprises:

a third resistor, the first terminal of the third resistor coupled with said second input terminal, the second terminal of the third resistor outputting said second ESD detection signal; and a third capacitor, the first terminal of the third capacitor coupled with said second terminal of said third resistor, the second terminal of the third capacitor coupled to said ground terminal.

24. The ESD protection circuit as claimed in claim 23, wherein said first capacitor, said second capacitor, and said third capacitor are all capacitors composed of MOSFETs.

* * * * *